United States Patent [19]

Houthoff et al.

[11] Patent Number: 4,498,094
[45] Date of Patent: Feb. 5, 1985

[54] JUNCTION FIELD EFFECT TRANSISTOR HAVING A SUBSTANTIALLY QUADRATIC CHARACTERISTIC

[75] Inventors: Jacobus Houthoff; Johannes J. Sips, both of Nijmegen, Netherlands

[73] Assignee: U.S. Philips Corporation, New York, N.Y.

[21] Appl. No.: 388,827

[22] Filed: Jun. 16, 1982

Related U.S. Application Data

[63] Continuation of Ser. No. 150,269, May 15, 1980, abandoned.

[30] Foreign Application Priority Data

May 29, 1979 [NL] Netherlands ............. 7904200

[51] Int. Cl.³ .......................................... H01L 29/80
[52] U.S. Cl. ......................................... 357/22; 357/86; 357/23
[58] Field of Search .................... 357/22, 23.1, 86

[56] References Cited

U.S. PATENT DOCUMENTS

| | | | |
|---|---|---|---|
| 3,222,810 | 12/1965 | Evans et al. | 357/22 |
| 3,283,221 | 11/1966 | Heiman | 357/23 |
| 3,316,131 | 4/1967 | Wisman | 357/22 |
| 3,656,031 | 4/1972 | Bresee et al. | 357/22 |
| 4,112,455 | 9/1978 | Seliger et al. | 357/22 |
| 4,119,996 | 10/1978 | Jhabvala | 357/22 |
| 4,176,368 | 11/1979 | Compton | 357/22 |
| 4,233,615 | 11/1980 | Takemoto et al. | 357/22 |

OTHER PUBLICATIONS

Sze, "Physics of Semiconductor Devices," 1969, Wiley, N.Y., p. 350.

Primary Examiner—Martin H. Edlow
Assistant Examiner—William A. Mintel
Attorney, Agent, or Firm—Robert T. Mayer; Steven R. Biren

[57] ABSTRACT

A substantially quadratic relationship between the channel current $I_{DS}$ and the gate voltage $V_{GS}$ is obtained over a substantial portion of the operating characteristic of a junction field effect transistor by the unique combination of two design features. First, a high-ohmic substrate sub-region is provided adjoining the channel region of the device, and second, the surface-adjoining source region is electrically connected to the underlying substrate. By using these two features, the value of the quantity $\beta$ is maintained substantially constant over the range of gate-to-source voltages of from zero volts to pinch-off.

6 Claims, 6 Drawing Figures

JUNCTION FIELD EFFECT TRANSISTOR HAVING A SUBSTANTIALLY QUADRATIC CHARACTERISTIC

This is a continuation of application Ser. No. 150,269, filed May 15, 1980, now abandoned.

BACKGROUND OF THE INVENTION

The invention relates to a junction field effect transistor having a substantially quadratic relationship between the channel current $I_{DS}$ and the gate voltage $V_{GS}$ over at least a part of the $I_{DS}-V_{GS}$ characteristic, comprising a semiconductor body having a semiconductor substrate of a first conductivity type which is provided with a surface region of the second, opposite conductivity type which adjoins the surface of the body and which comprises a source zone and a drain zone and an intermediately-located channel region of the second conductivity type, and which is provided with at least one surface-adjoining gate region which forms a rectifying junction with the channel region.

Circuit elements having a quadratic characteristic are generally desired because they give little or no nonlinear distortion in, for example, mixing devices and high frequency amplifier stages. Since no intermodulation occurs in a circuit element with a truly quadratic characteristic, such circuit elements can also be used very readily in tuning units (inter alia FM tuners).

The use of field effect transistors in this kind of circuits is generally known. It has been found, however, that they approach the quadratic characteristic only over a small part of the gate voltage range.

SUMMARY OF THE INVENTION

It is the object of the invention to provide a junction field effect transistor which shows a substantially truly quadratic relationship between the channel current and the gate voltage over a comparatively large range (compared to known field effect transistors).

A junction field effect transistor according to the invention is characterized in that the semiconductor substrate comprises a sub-region which adjoins at least the channel region and the doping concentration of which is at most approximately equal to that of the adjoining part of the channel region and in that the source zone is connected electrically to the semiconductor substrate.

Surprisingly, such a junction field effect transistor shows a substantially quadratic characteristic over a large tuning range. The effect which produces this improvement is not quite clear. A partial explanation may possibly be found in the fact that the assumption by which the quadratic relationship between the channel current and the gate voltage is derived in the usual junction field effect transistor does not apply.

In fact, upon formulating this relationship, the presence of an abrupt junction between the gate region and the channel region is assumed. In known junction field effect transistors the substrate is usually connected to the gate and with an opposite voltage at the gate the current through the channel will also be controlled by the depletion layer of the p-n junction between the substrate and the channel region.

Conventional devices are manufactured with a highly doped substrate and thereon a low-ohmic channel region in which subsequently, for example by diffusion, the source and drain zones and the gate zone are provided. During these subsequent process steps diffusion occurs from the substrate into the channel region and consequently the p-n junction between the channel region and the substrate will not form an abrupt junction, so that the assumption on which the quadratic formula is based no longer applies. Possibly this partly explains the deviation from the quadratic characteristic. However, it has been found experimentally that some improvement is obtained by providing a sub-region of the substrate adjoining the channel region with a lower doping concentration than the adjoining part of the channel region so as to prevent diffusion from the highly doped substrate part into the channel region, but for many applications this improvement is insufficient. A considerable improvement is obtained, however, when in addition the source zone is connected electrically to the substrate. It has been found that as a result of this unique combination of measures, a field effect transistor can be obtained having a substantially quadratic channel current-gate voltage characteristic over a wide range of gate voltage.

For completeness' sake it is to be noted that the measure to counteract diffusion from a highly doped substrate part into the channel region by means of a high-ohmic zone adjoining the channel region is known per se from U.S. Pat. No. 3,316,131. It is also to be noted that the connection of the source zone to the substrate is also known per se, for example, from U.S. Pat. No. 3,222,610.

However, the combination of the two measures in which the said particular effect is obtained is not disclosed in the said Patent Specifications.

An important preferred embodiment of a junction field effect transistor in accordance with the invention is characterized in that the doping concentration of the sub-region of the first conductivity type is lower than that of the adjoining part of the channel region.

BRIEF DESCRIPTION OF THE DRAWING

The invention will now be described in greater detail with reference to an embodiment and the drawing, in which.

The figures are diagrammatical and are not drawn to scale. In particular, for clarity the dimensions in the direction of thickness are greatly exaggerated in the cross-sectional views. Semiconductor zones of the same conductivity type are generally hatched in the same direction.

DETAILED DESCRIPTION

Figure 1:
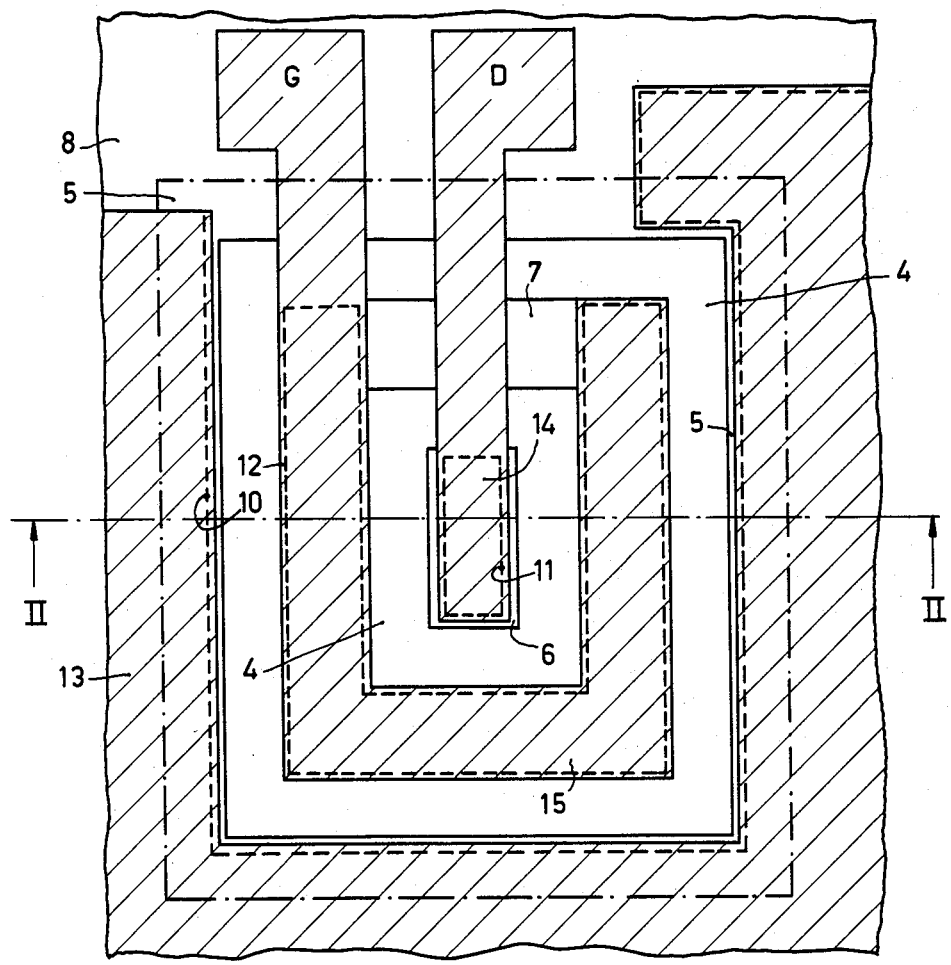
FIG. 1 is a plan view of a field effect transistor according to the invention.
Figure 2:
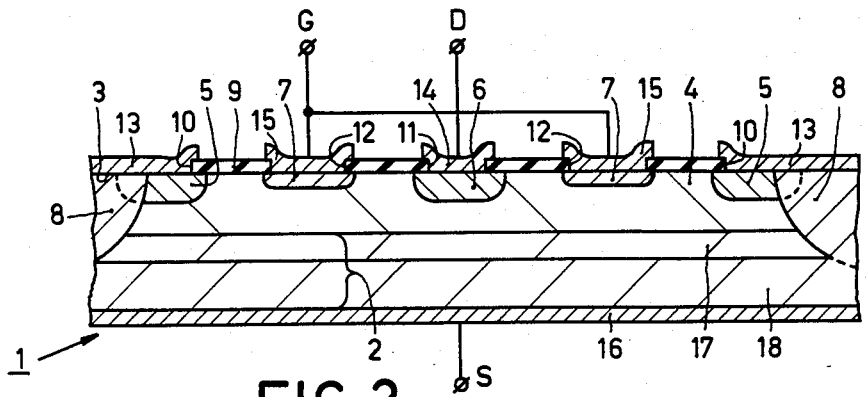
FIG. 2 is a cross-sectional view taken on the line II—II of FIG. 1.

FIG. 1 is a plan view and FIG. 2 is a cross-sectional view taken on the line II—II of FIG. 1 of a junction field effect transistor according to the invention.

It comprises a semiconductor body 1, in this example of silicon, with a substrate 2, in this example of the p-type conductivity. The semiconductor body 1 comprises a surface region 4 of the n-type conductivity adjoining the surface 3, in this example an epitaxial layer having a thickness of approximately 2 micrometers, and a doping of approximately $5.10^{15}$ atoms/cm$^3$, which corresponds to a resistivity of approximately 1 Ohm.cm. The source zone 5 and the drain zone 6, both of the n-type, are provided in the surface region 4, for example by diffusion of phosphorus atoms in a depth of approximately 0.7 micrometer. The gate region, which in this example is formed by a p-type surface zone 7 having a thickness of approximately 0.5 micrometer is present between the source zone and the drain zone. This gate region forms a rectifying junction with the surface region 4 which serves as a channel region between the source zone 5 and the drain zone 6.

Furthermore the semiconductor body 1 is protected at its surface 3 by means of an insulating layer 9, in this example of silicon oxide. The layer 9 has contact windows 10, 11 and 12 via which the zones 5, 6 and 7, respectively, are contacted by contact metallizations 13 (source), 14 (drain) and 15 (gate).

According to the invention the substrate 2 comprises a channel region-adjoining sub-region 17 having a doping concentration which is at most equal to that of the adjoining part of the channel region. The sub-region 17 is formed in this example by a p-type epitaxial layer having a thickness of approximately 4 micrometers and a doping concentration of approximately $3.10^{15}$ atoms/cm$^3$, which corresponds to a resistivity of approximately 4 Ohm.cm.

According to the invention, the source zone 5 is in addition short-circuited electrically to the substrate 2, in this example via a deep p+ diffusion 8, which at the surface 3 forms a p-n junction with the source zone 5, which p-n junction is short-circuited by the metallization 13.

In the present example the substrate 2 comprises in addition a high-ohmic contact zone 18 having a resistivity of 10–20 milliohm.cm. which is provided with a metallization 16 which contacts the substrate and hence the source zone 5 connected thereto. External contact connections G, D, and S are provided on the metallisations 14, 15 and 16, respectively.

Figure 3:
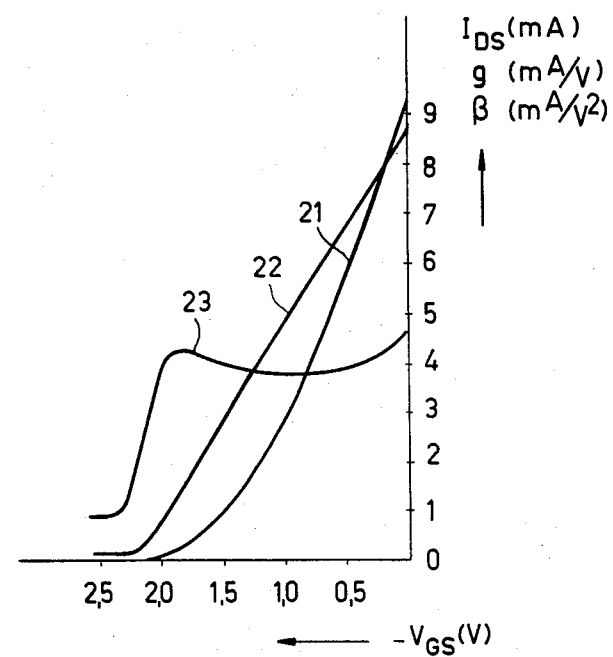
FIG. 3 shows a number of characteristic graphs of a field effect transistor according to the invention, In FIG. 4 the quantity $\beta$ (which is important for intermodulation) is compared as a function of the gate voltage for different field effect transistors.

FIG. 3 shows several characteristics of a junction field effect transistor in accordance with the invention.

Curve 21 shows the channel current as a function of the gate voltage $V_{GS}$. With an ideal quadratic characteristic it holds for this curve that:

$$I_{DS} = I_{DSS}\left(1 - \frac{V_{GS}}{V_p}\right)^2 = \frac{I_{DSS}}{V_p^2}(V_{GS} - V_p)^2 \quad (1)$$

$I_{DSS}$: $I_{DS}$ at $V_{GS}=0V$
$V_p$: pinch-off voltage.

Curve 22 represents the slope g for which it holds that:

$$g = \frac{\partial I_{DS}}{\partial V_{GS}} = \frac{2 I_{DSS}}{V_p^2} \cdot (V_{GS} - V_p). \quad (2)$$

In the ideal case the slope is a linear function of the gate voltage $V_{GS}$. The extent of linearity and hence the approach to an ideal quadratic $I_{DS}-V_{GS}$ characteristic can be seen with reference to the derivation of the slope:

$$\beta = \frac{\partial g}{\partial V_{GS}} = \frac{2 I_{DSS}}{V_p^2}. \quad (3)$$

In the ideal case this provides a constant value.
Substituting (3) in (1) gives:

$$I_{DS} = \tfrac{1}{2}\beta(V_{GS}-V_p)^2 \quad (4)$$

The quantity $\beta$ may be measured as follows. When an alternating voltage $V_g \cos wt$ is applied to the gate voltage $V_{GS}$ it holds from (4) for the channel current that:

$$\begin{aligned}
I_D &= I_{DS} + i_d = \tfrac{1}{2}\beta(V_{GS} - V_p + V_g \cos wt)^2 = \\
&\quad \tfrac{1}{2}\beta(V_{GS} - V_p)^2 + \beta(V_{GS} - V_p) V_g \cos wt + \\
&\quad \tfrac{1}{2}\beta V_g^2 \cos^2 wt \\
&= I_{DS} + \beta(V_{GS} - V_p) V_g \cos wt + \tfrac{1}{4}\beta V_g^2 \\
&\quad \cos 2wt + \tfrac{1}{4}\beta V_g^2.
\end{aligned}$$

The quantity $\beta$ can be simply determined by measuring the second harmonic current as a result of the extra input signal.

Curve 23 in FIG. 3 shows $\beta$ for a junction field effect transistor according to the invention. This curve shows a small variation over an operating range of $V_{GS}=0$ to the range where pinch off of the transistor is substantially reached ($-V_{GS}=2.0$ V). The transistor is not normally operated outside this range because the channel current becomes too low or the gate-channel junction is biased in the forward direction.

Figure 4:
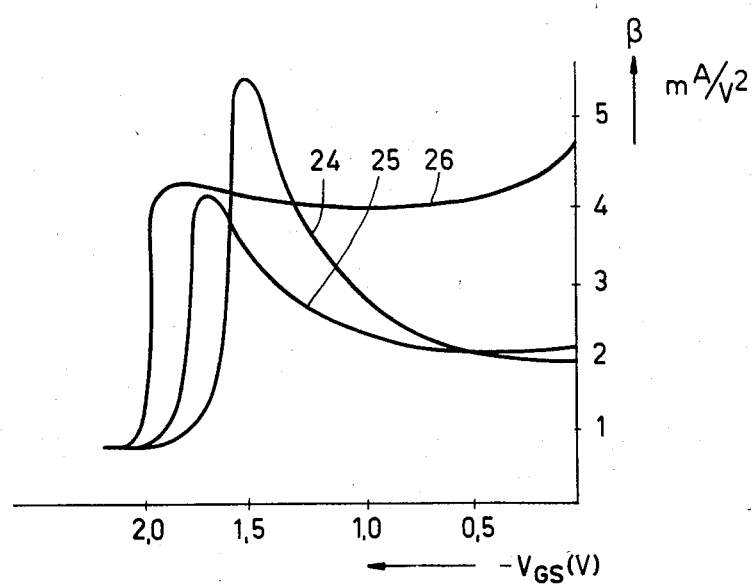

The improvement obtained is obvious from FIG. 4, in which the quantity $\beta$ for various types of junction field effect transistors is shown as a function of the gate voltage.

Curve 24 shows the $\beta-V_{GS}$ characteristic for a conventional junction field effect transistor (channel region on a highly doped substrate which is connected to the gate). Curve 25 represents the improvement mentioned above when in the conventional junction field effect transistor a high-ohmic zone of the same conductivity type as the substrate is provided. This curve remains constant over a slightly larger voltage range. Curve 26 shows the $\beta-V_{GS}$ characteristic for the junction field effect transistor according to the invention. By the unique combination of the high-ohmic sub-region in the substrate and the connection of the source zone with the substrate, the range over which $\beta$ is substantially constant is approximately doubled.

Figure 5:
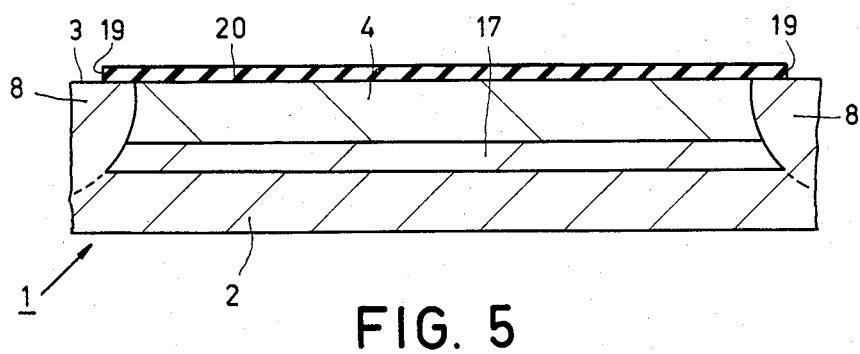
FIGS. 5 and 6 show the cross-sectional view of the device of FIG. 2 during various stages of the manufacturing process.
Figure 6:
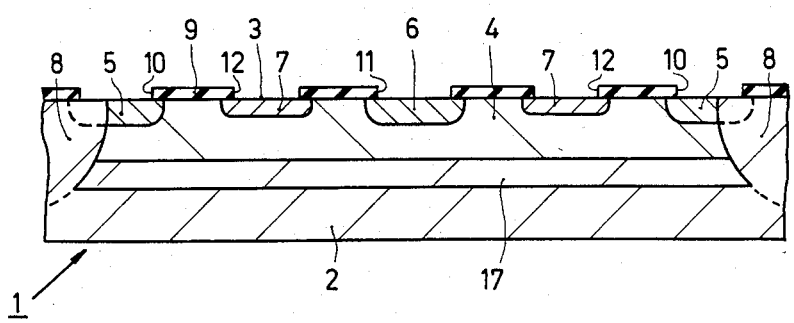

The junction field effect transistor shown in FIG. 2 can be manufactured as follows (FIGS. 5 and 6). Starting material is a body of low ohmic silicon oriented in the <111> direction with a resistivity of 10 to 20 milliohm.cm. This low-ohmic silicon forms the part 18 of the substrate; a high resistivity p-type layer 17 is then grown epitaxially thereon. The layer 17 in this example has a thickness of approximately 4 micrometers and a resistivity of 3.5–4.5 ohm.cm. A layer 4 of the n-type is provided on the layer 17 by epitaxial growth in a thickness of approximately 2 micrometers and a resistivity of approximately 1 ohm.cm.

The surface 3 is then provided with an oxide layer 20, for example by means of oxidation. Windows 19 are then etched in said oxide layer 20 for a subsequent deep p+ diffusion so that the p+ regions which constitute the connection between the source zone and the substrate are obtained. This diffusion which serves simultaneously as an isolation diffusion is carried out, for example, by deposition of boron nitride and then diffusion (FIG. 5).

The gate region 7 is obtained by means of a boron diffusion after a window suitable for that purpose has been provided in the oxide layer 20. This region extends down to a depth of approximately 0.5 micrometer.

The oxide layer 20, as well as the oxide grown during the diffusion steps, is then removed and replaced by a clean oxide layer 9 having a thickness of approximately 0.4 micrometer. Apertures 10 and 11 are formed in said oxide layer via which apertures the source region 5 and the drain region 6 are provided, for example by diffusion of phosphorus or arsenic.

After having subsequently formed apertures 12 in the oxide layer 9 (FIG. 6) above the gate region 7 and having removed said oxide above the p+ region 8, a metallization layer of, for example, aluminum is deposited over the whole surface. The metallizations 13, 14 and 15 are then formed from said layer by masked etching. After having provided the substrate on its lower side with a metallization 16 the junction field effect transistor shown in FIG. 2 is obtained.

It will be obvious that the invention is not restricted to the above example but that many variations are possible to those skilled in the art without departing from the scope of this invention. For example, the conductivity type of the various semiconductor zones and regions may (simultaneously) be reversed. The surface zones 6 and 7 may also be formed by means of ion implantataion instead of by diffusion. Furthermore the region 4 may be formed by an n diffusion and a high-ohmic material of the p-type instead of by epitaxial growth. Instead of silicon, any other semiconductor material may be used, for example gallium-arsenide or another III-V compound.

The gate region may also comprise a shallow surface zone which is formed by providing highly doped polycrystalline silicon of the p-type from which the surface zone is formed by diffusion. In addition, several gate regions may be present between the source zone and the drain zone.

What is claimed is:

1. A junction field effect transistor, which comprises:
    a semiconductor body having a semiconductor substrate of a first conductivity type;
    a semiconductor surface region of a second conductivity type opposite to that of the first and located on a first major surface of said substrate;
    surface-adjoining source and drain zones of said second conductivity type in said surface region and a channel region of said second conductivity type therebetween;
    a surface-adjoining gate region of said first conductivity type in said surface region and between said source and drain zones which forms a rectifying junction with said channel region; and
    means for maintaining the value of the quantity $\beta$ substantially constant over a range of gate-to-source voltage of from zero volts to pinch off, comprising, in combination, a sub-region of the semiconductor substrate of the first conductivity type located at said first major surface and adjacent said channel region, and having a doping concentration which is less than that of the remainder of said substrate and at most approximately equal to that of the adjacent part of the channel region, and means for electrically connecting said surface-adjoining source zone and the underlying semiconductor substrate.

2. A junction field effect transistor as claimed in claim 1, characterized in that said means for electrically connecting the source zone and the semiconductor substrate comprises:
    a further zone of the first conductivity type which contacts said surface-adjoining source zone to form a p-n junction therewith and which extends from the surface of said surface region down to said substrate; and
    a metal layer on said surface which connects said source zone and said further zone.

3. A junction field effect transistor as claimed in claim 1, characterized in that the doping concentration of the sub-region of the first conductivity type is lower than that of the adjoining part of the channel region.

4. A junction field effect transistor as claimed in claim 1, 2 or 3, characterized in that the sub-region is formed by a layer which is provided epitaxially on a carrier of the same conductivity type which has a higher doping concentration than that of the sub-region, the sub-region being of sufficient thickness to prevent the p-n junction between the channel and the substrate from being influenced as a result of the diffusion of impurities from the carrier to the p-n junction during manufacture.

5. A junction field effect transistor as claimed in claim 4, characterized in that the surface region is formed by an epitaxial layer of the second conductivity type grown on the epitaxial layer of the first conductivity type which forms the sub-region.

6. A junction field effect transistor as claimed in claim 2, characterized in that a source electrode is provided on a second major surface of said substrate which is opposite said first major surface.

* * * * *